United States Patent
Higashi et al.

(10) Patent No.: US 10,910,192 B2
(45) Date of Patent: Feb. 2, 2021

(54) ION SOURCE, ION IMPLANTATION APPARATUS, AND ION SOURCE OPERATING METHOD

(71) Applicant: ULVAC, INC., Chigasaki (JP)

(72) Inventors: Akio Higashi, Chigasaki (JP); Naruyasu Sasaki, Chigasaki (JP); Toshihiro Terasawa, Chigasaki (JP)

(73) Assignee: ULVAC, INC., Kanagawa (JP)

(*) Notice: Subject to any disclaimer, the term of this patent is extended or adjusted under 35 U.S.C. 154(b) by 0 days.

(21) Appl. No.: 16/639,184

(22) PCT Filed: Aug. 10, 2018

(86) PCT No.: PCT/JP2018/030048
§ 371 (c)(1),
(2) Date: Feb. 14, 2020

(87) PCT Pub. No.: WO2019/054111
PCT Pub. Date: Mar. 21, 2019

(65) Prior Publication Data
US 2020/0402759 A1    Dec. 24, 2020

(30) Foreign Application Priority Data

Sep. 14, 2017 (JP) .................... 2017-176451

(51) Int. Cl.
*H01J 37/08* (2006.01)
*H01J 37/317* (2006.01)
(Continued)

(52) U.S. Cl.
CPC .............. *H01J 37/08* (2013.01); *C23C 14/48* (2013.01); *H01J 37/16* (2013.01);
(Continued)

(58) Field of Classification Search
CPC .......... H01J 27/022; H01J 27/04; H01J 27/14; H01J 37/08; H01J 37/3171; H01J 37/32412
See application file for complete search history.

(56) References Cited

U.S. PATENT DOCUMENTS

2002/0070672 A1* 6/2002 Horsky ................. H01L 21/425
                                                        315/111.81
2017/0110282 A1* 4/2017 White ..................... H01J 37/08

FOREIGN PATENT DOCUMENTS

JP    H01-235130 A    9/1989
JP    H01-159353 U    11/1989
(Continued)

OTHER PUBLICATIONS

Oct. 23, 2018 International Search Report issued in International Patent Application No. PCT/JP2018/030048.

*Primary Examiner* — David E Smith
*Assistant Examiner* — Hsien C Tsai
(74) *Attorney, Agent, or Firm* — Oliff PLC

(57) ABSTRACT

An ion source includes a vacuum chamber having a cooling mechanism, an ion generation container for reacting an ionized gas with an ion material so as to generate ions, an extraction electrode for extracting ions generated in the ion generation container and generating an ion beam, and a shielding member provided inside and in the vicinity of an inner wall of the vacuum chamber, and having a main body made of a conductive metal for blocking deposition of an insulating material on the inner wall (10d) of the vacuum chamber. The main body of the shielding member has a plurality of protruding support portions that is in contact with the inner wall of the vacuum chamber for supporting the main body in a manner such that the main body is fitted at a distance from the inner wall of the vacuum chamber.

8 Claims, 8 Drawing Sheets

(51) Int. Cl.
  *C23C 14/48* (2006.01)
  *H01J 37/16* (2006.01)
(52) U.S. Cl.
  CPC ..... *H01J 37/3171* (2013.01); *H01J 2237/002* (2013.01); *H01J 2237/022* (2013.01)

(56) References Cited

FOREIGN PATENT DOCUMENTS

| | | | |
|---|---|---|---|
| JP | H05-182623 | A | 7/1993 |
| JP | 2001-76635 | A | 3/2001 |
| JP | 2011-124059 | A | 6/2011 |
| JP | 2016-177870 | A | 10/2016 |

\* cited by examiner

ION SOURCE, ION IMPLANTATION APPARATUS, AND ION SOURCE OPERATING METHOD

TECHNICAL FIELD

The present disclosure generally relates to an ion source, and more particularly, relates to a maintenance technique for an ion source used in an ion implantation apparatus.

BACKGROUND ART

In recent years, methods of manufacturing silicon carbide (SiC) substrates, which are excellent in heat resistance and voltage resistance compared to existing silicon (Si) substrates, have been established, and SiC substrates are available relatively inexpensively.

Processes using SiC substrates include a process by which aluminum ions are implanted as a dopant. The process uses an ion implantation apparatus having an ion source for generating aluminum ion beams.

FIG. 10 is a cross-sectional view showing the interior of a conventional ion source.

As shown in FIG. 10, this ion source 50 has a vacuum chamber 51 that is formed of metal, such as, stainless steel in a cylindrical shape, for example, and is connected to a vacuum exhaust (not shown). Inside the vacuum chamber 51, an ion generation container 52 for reacting an ionized gas with an ion material and generating ions, and an extraction electrode 53 for extracting ions generated in the ion generation container 52 and generating an ion beam are provided.

Here, the ion generation container 52 is held by a holding mechanism 54 made of metal in a position near a beam emission aperture 51a in the vacuum chamber 51. The holding mechanism 54 is integrally formed with a lid 51c of the vacuum chamber 51. The lid 51c is made of metal, and is electrically insulated from the vacuum chamber 51 by an insulator 55.

Then, a positive voltage is applied from an extraction power supply 56 to the ion generation container 52 through the lid 51c and the holding mechanism 54, and a negative voltage is applied from an acceleration power supply 58 to the extraction electrode 53 that is electrically insulated from the vacuum chamber 51 by an insulator 57.

When such a ion source 50 generates aluminum ions, aluminum nitride or alumina placed in the ion generation container 52 is reacted with a fluorine gas (for example, $PF_3$) introduced into the ion generation container 52 to be ionized (converted into plasma), and an ion beam is extracted from a slit 52a of the ion generation container 52 by applying voltage to the extraction electrode 53, and is emitted from the beam emission aperture 51a of the vacuum chamber 51 through a beam aperture 53a of the extraction electrode 53.

However, this method in which the aluminum nitride or the like is reacted with $PF_3$ has the problem that insulating aluminum fluoride ($AlF_x$) is generated as a by-product, and an insulating film of the generated aluminum fluoride deposited on an inner wall inside the vacuum chamber 51 (of insulating films 160 and 161, particularly the insulating film 160) causes abnormal discharge in the vacuum chamber 51.

When such abnormal discharge occurs, ion beam current fluctuates, reducing the yield of ion implantation objects, and in addition, electromagnetic noise may cause a failure in a power supply or a vacuum pump of the ion implantation apparatus.

Thus, in the conventional art, when abnormal discharge occurs frequently, the vacuum chamber 51 of the ion source 50 is opened to the air atmosphere to remove the insulating film 160. However, the conventional technique requires such maintenance to be frequently performed, causing the problem of reduced generation efficiency.

CITATION LIST

Patent Literature

Patent Literature 1: JP 5-182623 A

SUMMARY

Technical Problem

The present disclosure has been made to solve the above-mentioned problems of the conventional technique. It is an object of the present disclosure to provide a technique for preventing abnormal discharge caused by an insulating film formed by a by-product of reacting an ionized gas with an ion material and generating ions in an ion generation container of an ion source.

Solution to Problem

One aspect of the present disclosure that can solve the above problems includes an ion source including a vacuum chamber having a cooling mechanism, an ion generation container provided in the vacuum chamber, to react an ionized gas with an ion material so as to generate ions, an extraction electrode provided in the vacuum chamber, for extracting ions generated in the ion generation container so as to generate an ion beam, and a shielding member provided inside and in the vicinity of an inner wall of the vacuum chamber, and having a main body made of a conductive metal for blocking deposition of an insulating material on the inner wall of the vacuum chamber, wherein the main body of the shielding member is provided with a plurality of protruding support portions that is in contact with the inner wall of the vacuum chamber for supporting the main body so that the main body is fitted at a distance from the inner wall of the vacuum chamber.

In some embodiments, the ion source is also effective when the shielding member is configured to be attachably and detachably fitted in the vacuum chamber.

In some embodiments, the ion source is also effective when the shielding member is configured to be electrically connected to the inner wall of the vacuum chamber when fitted in the vacuum chamber.

In some embodiments, the ion sources is also effective when the main body of the shielding member is formed from a plate-shaped member.

In some embodiments, the main body of the shielding member is formed in a cylindrical shape.

Another aspect of the disclosure relates to an ion implantation apparatus including an ion source including, a vacuum chamber having a cooling mechanism, an ion generation container provided in the vacuum chamber, to react an ionized gas with an ion material so as to generate ions, an extraction electrode provided in the vacuum chamber, to extract ions generated in the ion generation container so as to generate an ion beam, and a shielding member provided inside and in the vicinity of an inner wall of the vacuum chamber, and having a main body made of a conductive metal for blocking deposition of an insulating material on the inner wall of the vacuum chamber, wherein the main body of the shielding member is provided with a plurality of protruding support portions that is in contact with the inner wall of the vacuum chamber for supporting the main body in a manner such that the main body is fitted at a distance from the inner wall of the vacuum chamber, and wherein the ion implantation apparatus is configured to irradiate a substrate with an ion beam emitted from the ion source so as to implant ions.

Another aspect of the disclosure relates to a method of operating an ion source including an ion generation container provided in a vacuum chamber having a cooling mechanism, the ion source being configured to allow an ionized gas to react with an ion material so as to generate ions, and extracting ions generated in the ion generation container so as to generate an ion beam, the method includes the step of heating an insulating film generated as a by-product in a process of reaction in the ion generation container and deposited inside the vacuum chamber during operation of the ion source.

Advantageous Effects

In embodiments, the shielding member having, for example, the plate-shaped main body made of a conductive metal for blocking the deposition of an insulating material on the inner wall of the vacuum chamber is provided inside and in the vicinity of the inner wall of the vacuum chamber, so that the insulating film formed by the by-product of reacting the ionized gas with the ion material and generating ions in the ion generation container of the ion source is not deposited on the inner wall of the vacuum chamber but is deposited on a surface of the main body of the shielding member, that is, an inner wall of the shielding member.

The main body of the shielding member is provided with the plurality of protruding support portions that is in contact with the inner wall of the vacuum chamber for supporting the main body, so that the main body is fitted at a distance from the inner wall of the vacuum chamber having the cooling mechanism. Consequently, the temperature of the main body of the shielding member during the operation of the ion source is hardly affected by the temperature of the inner wall of the vacuum chamber cooled by the cooling mechanism, and is kept high (at about some hundreds of degrees Celsius) under the influence of radiant heat from, for example, the ion generation container in the vacuum chamber.

As a result, according to the embodiments, the temperature of the insulating film deposited on the inner wall of the main body of the shielding member is also about some hundreds of degrees Celsius. This reduces the resistance value of the insulating film, preventing the occurrence of abnormal discharge. Consequently, the maintenance cycle of the ion source can be made longer than the maintenance cycle of the conventional technique.

Further, in the embodiments, the protruding support portions of the shielding member are in contact with the inner wall of the vacuum chamber at a plurality of contact points. Temperature changes in the vacuum chamber cause the plurality of contact portions to expand and contract, thereby causing the contact portions to move. This can automatically remove oxide films on the inner wall of the vacuum chamber over a long period of time (self-cleaning).

On the other hand, in some embodiments, if the shielding member is configured to be attachably and detachably fitted in the vacuum chamber, maintenance work can be easily performed by removing the shielding member from the vacuum chamber.

Furthermore, in the present disclosure, if the shielding member is configured to be electrically connected to the inner wall of the vacuum chamber when fitted in the vacuum chamber, the potential of the shielding member can be made equal to the potential of the vacuum chamber (e.g. ground potential). Consequently, electrical discharges between the shielding member and the inner wall of the vacuum chamber can be prevented.

In this case, in embodiments, the shielding member is supported on the inner wall of the vacuum chamber by the plurality of protruding support portions, so that the contact resistance of the shielding member against the inner wall of the vacuum chamber can be stabilized to achieve high connection reliability, and thus, electrical discharges between the shielding member and the inner wall of the vacuum chamber can be reliably prevented.

Furthermore, in some embodiments, when the main body is formed in a plate shape, the support portions can be easily provided, for example, by performing a protrusion forming process.

Furthermore, in some embodiments, when the main body is formed in a cylindrical shape, it can be easily fitted inside at the vicinity of the inner wall of the cylindrical vacuum chamber.

DESCRIPTION OF EMBODIMENT

Hereinafter, an embodiment of the present disclosure will be discussed with reference to the drawings.

Figure 1:
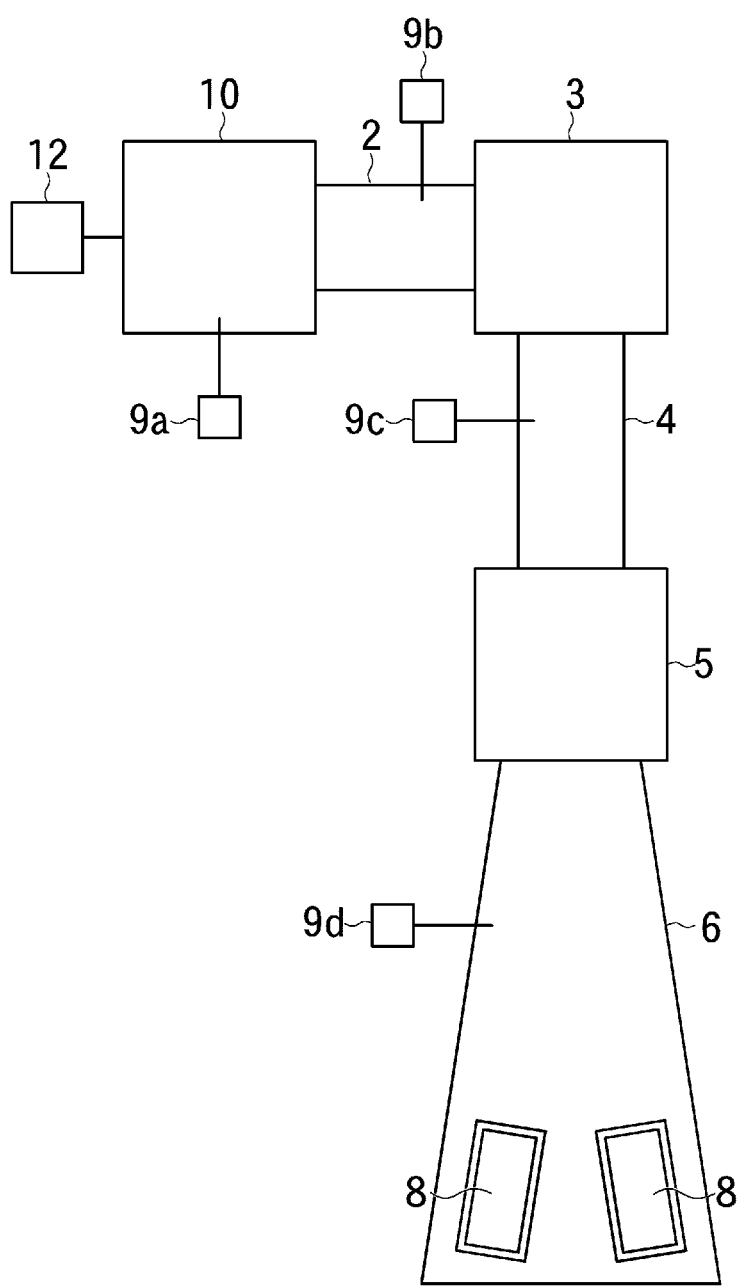
FIG. 1 is a schematic configuration diagram showing the entirety of an ion implantation apparatus using an ion source of the present disclosure.

FIG. 1 is a schematic configuration diagram showing the entirety of an ion implantation apparatus using an ion source of the present disclosure.

As shown in FIG. 1, an ion implantation apparatus 1 of the present example includes an ion source 10 discussed later, a travel chamber 2, a mass spectrometer 3, an acceleration device 4, a scanning device 5, and an implantation chamber 6, which are connected in this order.

The ion implantation apparatus 1 is configured such that the ion source 10, the travel chamber 2, the acceleration device 4, and the implantation chamber 6 are vacuum evacuated by evacuators 9a to 9d, respectively.

A gas supply unit 12 discussed later is connected to the ion source 10, gas supplied by the gas supply unit 12 is ionized, and the generated ions are made travel inside the travel chamber 2 as an ion beam and enter the mass spectrometer 3.

Inside the mass spectrometer 3, the ions in the ion beam are mass analyzed, and ions having a desired charge-to-mass ratio are allowed to pass and enter the acceleration device 4 as an ion beam.

The acceleration device 4 accelerates positive ions in the ion beam to cause them to enter the scanning device 5. The scanning device 5 causes the ion beam to enter the implantation chamber 6 while controlling the traveling direction of the ion beam.

Inside the implantation chamber 6, a plurality of (two here) substrates 8 is disposed. The scanning device 5 discussed above directs the ion beam toward one of the plurality of substrates 8, emitting ions while scanning the surfaces of the substrates 8 one by one, thereby implanting the ions in the substrates 8.

Figure 2:
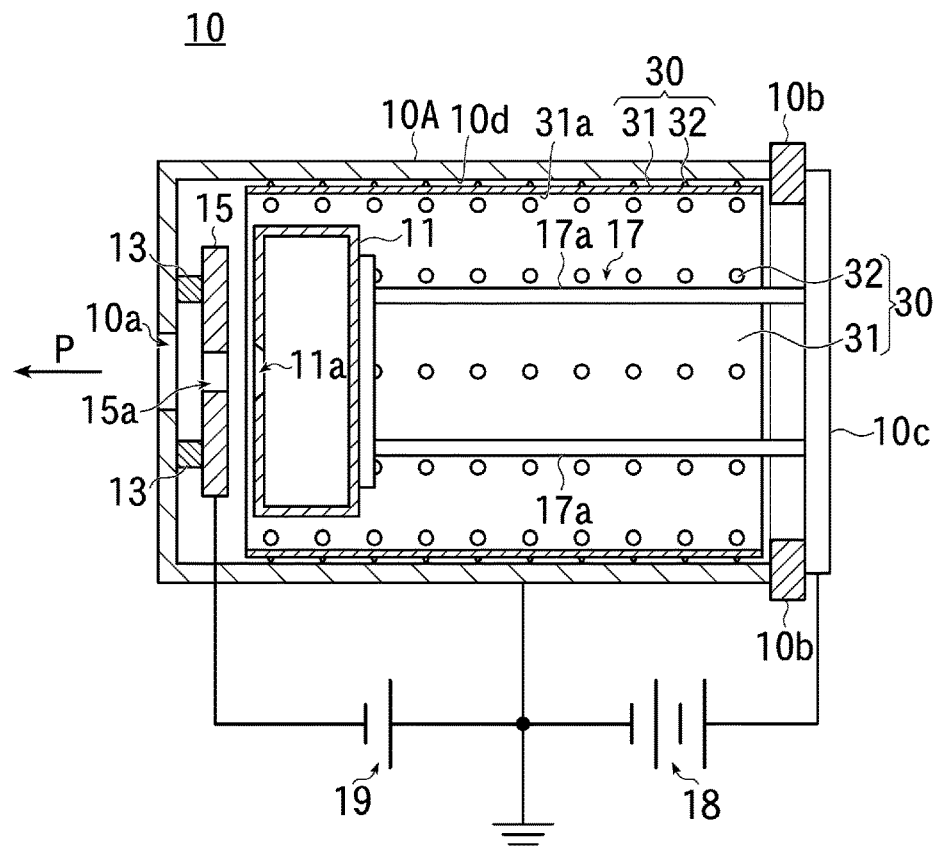
FIG. 2 is a partially cross-sectional view showing the internal configuration of an example of the ion source according to the present disclosure.

FIG. 2 is a partially cross-sectional view showing the internal configuration of an example of the ion source according to the present embodiment.

Figure 3:
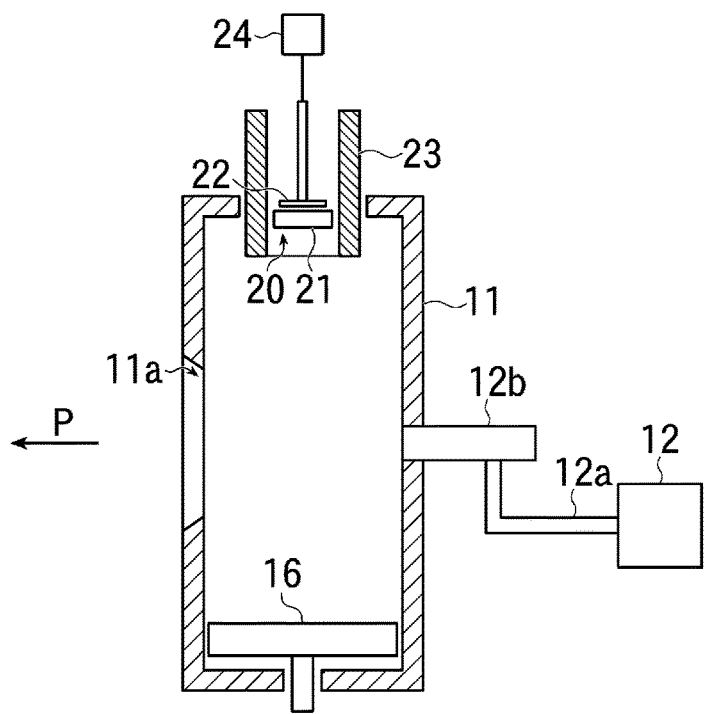
FIG. 3 is a partially cross-sectional view showing the internal configuration of an ion generation container of the ion source.

FIG. 3 is a partially cross-sectional view showing the internal configuration of an ion generation container of the ion source.

As shown in FIG. 2, the ion source 10 of the present embodiment has a vacuum chamber 10A made of a conductive metal such as stainless steel and formed, for example, in a cylindrical shape. The vacuum chamber 10A has a cooling mechanism (not shown) for cooling itself to a predetermined temperature by circulating a refrigerant (such as, water).

In the vacuum chamber 10A, an ion generation container 11 for reacting an ionized gas with an ion material so as to generate ions, an extraction electrode 15 for extracting ions generated in the ion generation container 11 and generating an ion beam, and a shielding member 30 discussed later are provided.

Here, the ion generation container 11 is held by a holding mechanism 17 made of metal in a position near a beam emission aperture 10a in the vacuum chamber 10A.

The holding mechanism 17 is integrally formed with a lid 10c attached to the vacuum chamber 10A opposite the beam emission aperture 10a. The lid 10c is made of a conductive metal, and is electrically insulated from the vacuum chamber 10A by an insulator 10b.

Regarding to the holding mechanism 17, the ion generation container 11 is integrally mounted to the lid 10c via a pair of holding rods 17a made of a conductive metal, for example, whereby the ion generation container 11 made of a conductive metal is electrically connected to the lid 10c.

In addition, the ion generation container 11 of the present embodiment is electrically insulated from the vacuum chamber 10A.

The ion generation container 11 is formed, for example, in a rectangular box shape.

The ion generation container 11 of the present embodiment is disposed with its longitudinal direction directed in a direction orthogonal to an ion emission (traveling) direction, and a slit 11a for emitting ions from the inside of the ion generation container 11 is provided at downstream side in the ion emission direction P.

On the other hand, the extraction electrode 15 is provided in the vacuum chamber 10A between the ion generation container 11 and the beam emission aperture 10a of the vacuum chamber 10A.

Here, the extraction electrode 15 is mounted to an inner wall 10d of the vacuum chamber 10A located in the ion emission direction P via an insulator 13, thereby being electrically insulated from the vacuum chamber 10A.

A beam aperture 15a for passing an ion beam is provided at the central portion of the extraction electrode 15. The beam aperture 15a is disposed on the same path as the slit 11a of the ion generation container 11 and the beam emission aperture 10a of the vacuum chamber 10A.

In the present embodiment, the vacuum chamber 10A is grounded, and is configured to apply a positive voltage relative to ground potential to the ion generation container 11 from an extraction power supply 18 through the lid 10c of the vacuum chamber 10A and the holding mechanism 17, and apply a negative voltage relative to ground potential to the extraction electrode 15 from an acceleration power supply 19.

As shown in FIG. 3, the gas supply unit 12 for supplying an ionized gas made, for example, of phosphorus trifluoride ($PF_3$) is provided in the ion generation container 11 at the upstream side of the ion emission direction P.

The gas supply unit 12 of the present embodiment is connected via a gas introduction pipe 12a to a gas supply pipe 12b that is provided upstream side of the ion emission direction P of the ion generation container 11 for introducing the ionized gas into the ion generation container 11.

A thermionic emission unit 20 for emitting thermoelectrons by heating using a hot cathode is provided at one wall of the ion generation container 11 at a direction orthogonal to the ion emission direction P. An opposite repeller electrode 16 that is provided at the other wall in the direction orthogonal to the ion emission direction P opposite to the thermionic emission unit 20 and is configured to have a negative potential.

In the present embodiment, the hot cathode includes a cathode 21 having a bottomed cylindrical shape, for example, and a filament 22 provided on the back side inside the cathode 21, and connected to a power supply 24. Here, the cathode 21 made, for example, of tungsten (W) is used.

On the other hand, an ion material member 23 is provided around the cathode 21.

The ion material member 23 is made, for example, of aluminum nitride (AlN), and is provided to surround the periphery of the cathode 21 to be heated by the cathode 21.

Meanwhile, in the present embodiment, the shielding member 30 is provided inside and in the vicinity of the inner wall 10d of the vacuum chamber 10A.

Figure 4:
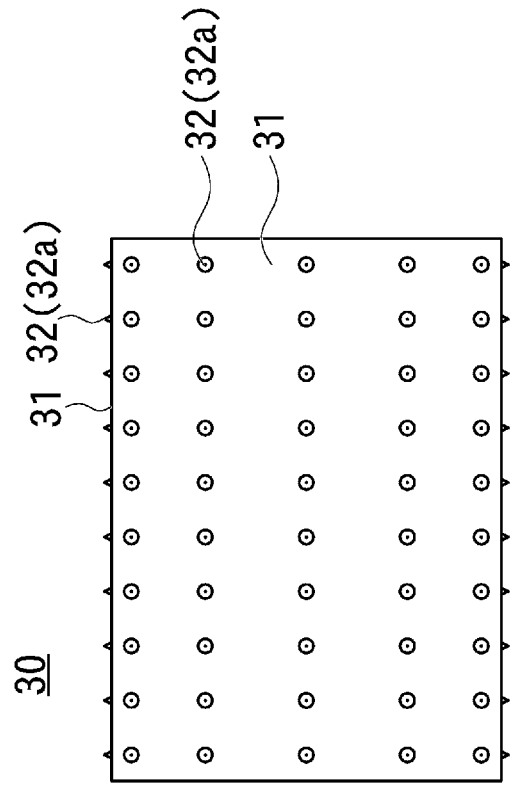
FIG. 4(a) is a front view showing a shielding member in accordance with the present disclosure.
FIG. 4(b) is a side view of the shielding member.
Figure 4:
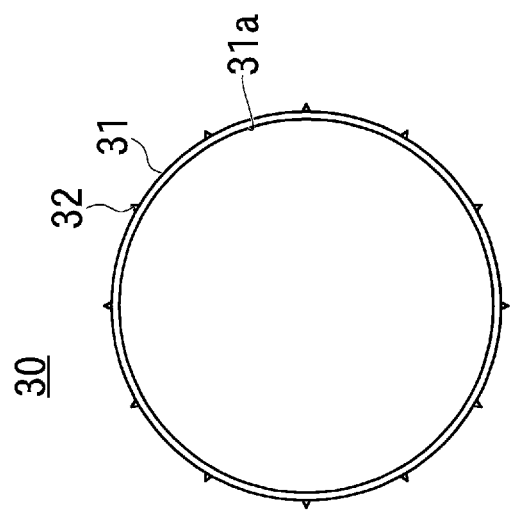
Figure 5B:
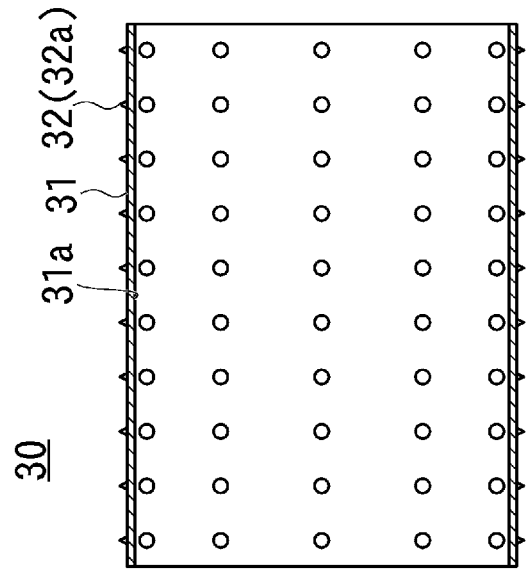
FIG. 5(b) is a cross-sectional view taken along line A-A in FIG. 5(a).
Figure 5A:
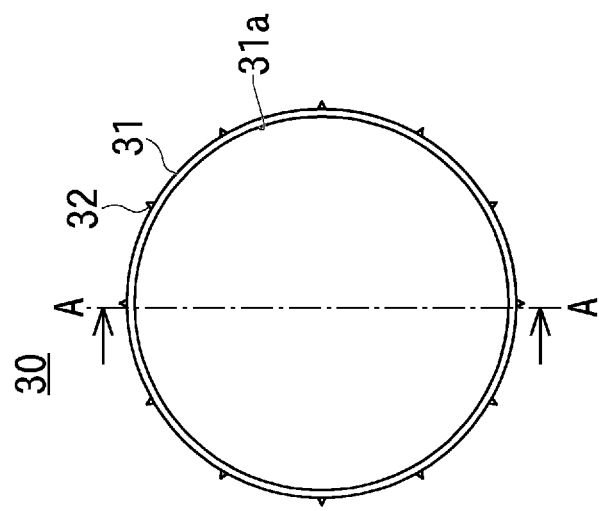
FIG. 5(a) is a front view of the shielding member.

FIGS. 4(a) and 4(b) and FIGS. 5(a) and 5(b) show the shielding member of the present embodiment. FIG. 4(a) is a front view, FIG. 4(b) is a side view, FIG. 5(a) is a front view, and FIG. 5(b) is a cross-sectional view taken along line A-A in FIG. 5(a).

Figure 6B:
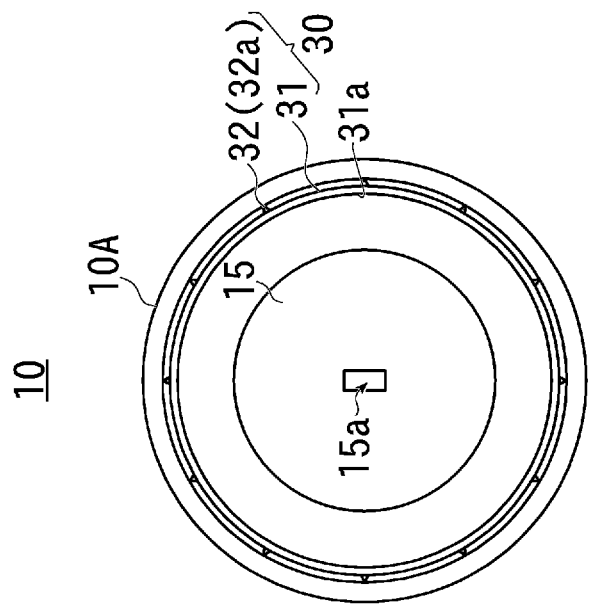
FIG. 6(b) is a front view showing the internal configuration of the vacuum chamber in which the shielding member is disposed.
Figure 6A:
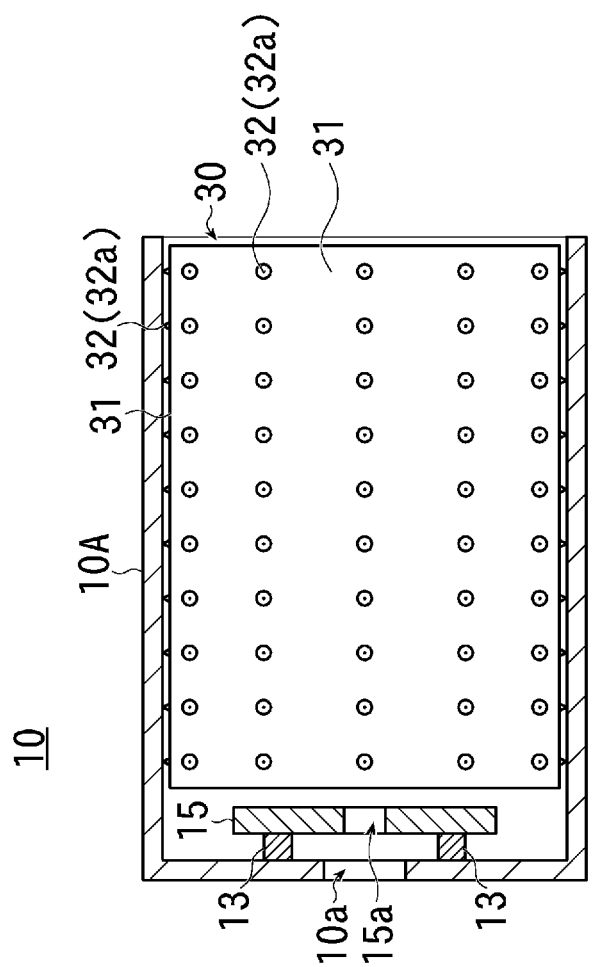
FIG. 6(a) is a partially cross-sectional view showing the internal configuration of a vacuum chamber in which the shielding member is disposed.

FIGS. 6(a) and 6(b) show the shielding member disposed in the vacuum chamber. FIG. 6(a) is a partially cross-sectional view showing the internal configuration, and FIG.

6(b) is a front view showing the internal configuration. In FIGS. 6(a) and 6(b), the ion generation container is removed.

The shielding member 30 of the present embodiment is made, for example, of a conductive metal, such as, stainless steel, and has a main body 31 formed, for example, in a cylindrical shape, and a plurality of support portions 32 provided at predetermined intervals on an outer surface of the main body 31.

The main body 31 of the shielding member 30 is obtained, for example, by bending a rectangular metal plate to form a cylindrical shape.

In the present embodiment, the main body 31 of the shielding member 30 is formed to have an outer diameter slightly smaller than the inner diameter of the vacuum chamber 10A (see FIGS. 6(a) and 6(b)).

The plurality of protruding support portions 32 formed to protrude outward from the cylinder is provided on the outer surface of the main body 31.

The support portions 32 are in contact with the inner wall 10d of the vacuum chamber 10A for supporting the main body of the shielding member 30 so that the main body 31 is fitted at a distance from the inner wall 10d of the vacuum chamber 10A.

The support portions 32 can be easily provided, for example, by performing a protrusion forming process on the main body 31 formed from a plate-shaped member.

In the present embodiment, the shielding member 30 can be easily disposed in the vacuum chamber 10A by bending a rectangular metal plate into a cylindrical shape, and then, inserting it in that state into the vacuum chamber 10A, for example.

In this case, when the main body 31 of the shielding member 30 is bent into a cylindrical shape without joining both ends of the main body 31 and inserted into the vacuum chamber 10A, and the restoring force of the main body 31 due to its resiliency brings the tops 32a of the plurality of support portions 32 into contact with the inner wall 10d of the vacuum chamber 10A, the shielding member 30 can be easily fitted in the vacuum chamber 10A in a fixed state (see FIGS. 6(a) and 6(b)).

Furthermore, both ends of the main body 31 of the shielding member 30 may be joined together to form it in one cylindrical body.

In the present embodiment, the shielding member 30 can be configured to be removably fitted in the vacuum chamber 10A.

The support portions 32 of the shielding member 30 are formed to have an equal height, for example, and are provided such that when the shielding member 30 is disposed in the vacuum chamber 10A, their respective tops 32a are in point contact (contact in a minute area) with the inner wall 10d of the vacuum chamber 10A.

Thus, the portions of the outer surface of the main body 31 of the shielding member 30 are uniformly spaced from the inner wall 10d of vacuum chamber 10A by a predetermined distance, so as not to contact the inner wall 10d of vacuum chamber 10A.

When the shielding member 30 is disposed inside the vacuum chamber 10A, it is electrically connected to the inner wall 10d of the vacuum chamber 10A.

The shielding member 30 of the present embodiment is provided to cover substantially the whole area of the inner wall 10d of the vacuum chamber 10A.

In this configuration, when predetermined voltages are applied from the extraction power supply 18 and the acceleration power supply 19 shown in FIG. 2, the fluorine gas ($PF_3$) is introduced into the ion generation container 11 from the gas supply unit 12 through the gas introduction pipe 12a and the gas supply pipe 12b, plasma is generated in the ion generation container 11, and the aluminum nitride reacts with the fluorine gas, thereby aluminum (Al) ions are generated.

Then, the generated aluminum ions are emitted from the slit 11a, and are further emitted from the vacuum chamber 10A as an ion beam through the beam aperture 15a of the extraction electrode 15 charged to a negative potential and the beam emission aperture 10a of the vacuum chamber 10A.

In this case, aluminum fluoride ($AlF_x$) is generated in a gaseous state as a by-product in the above-discussed reaction process.

Figure 7:
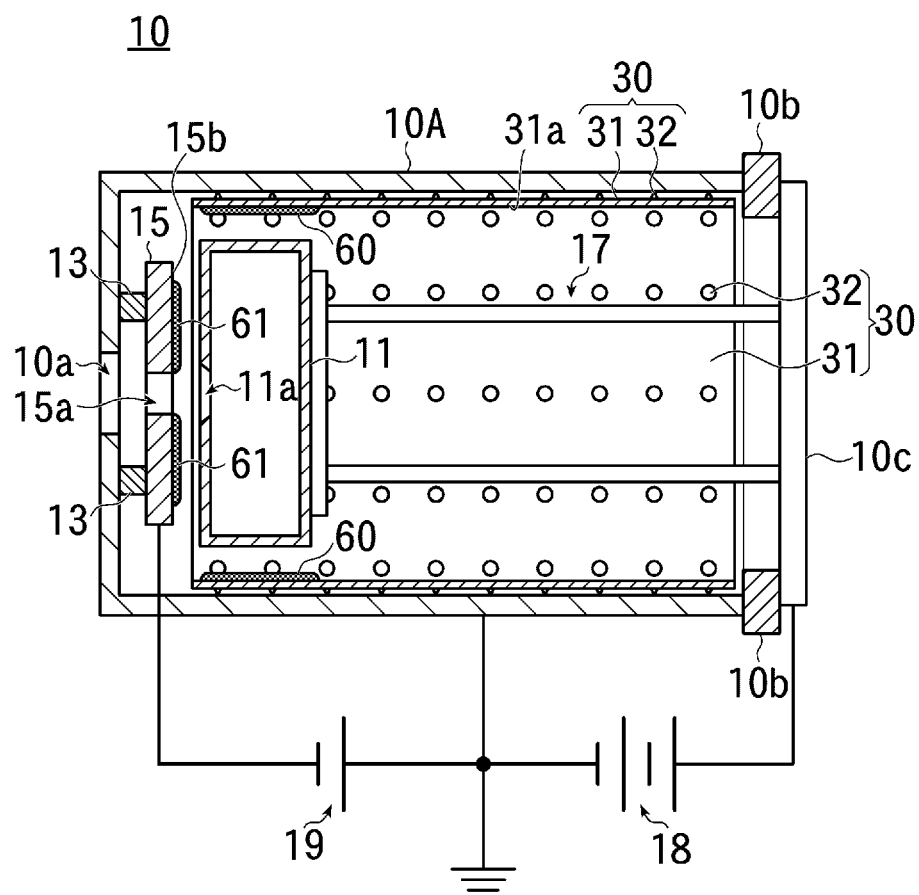
FIG. 7 is a partially cross-sectional view showing the internal configuration of the ion source in accordance with the present disclosure in which insulating films are deposited.

As shown in FIG. 7, the aluminum fluoride is deposited as insulating films 60 and 61 mainly on an inner wall 31a of the main body of the shielding member 30 and a surface 15b of the extraction electrode 15 in the vicinity of the ion generation container 11 in the vacuum chamber 10A.

The present embodiment prevents abnormal discharge even if such insulating films 60 and 61 exist in the vacuum chamber 10A.

First, a mechanism by which abnormal discharge occurs during reaction for generating aluminum ions is generally considered to be as follows.

Specifically, in the above-discussed reaction process, when an insulating film (not shown) made of a reaction by-product is formed, for example, on the inner wall of the vacuum chamber (not shown) inside the vacuum chamber, charged particles collide with the insulating film, causing charge-up.

At a point in time when the withstand voltage limit of the insulating film is reached due to the charge-up, a minute breakdown occurs in the insulating film.

As a result, there is a phenomenon where gas or charged particles emitted from the insulating film triggers an instantaneous short circuit caused by the extraction voltage applied to the vacuum chamber.

Figure 10:
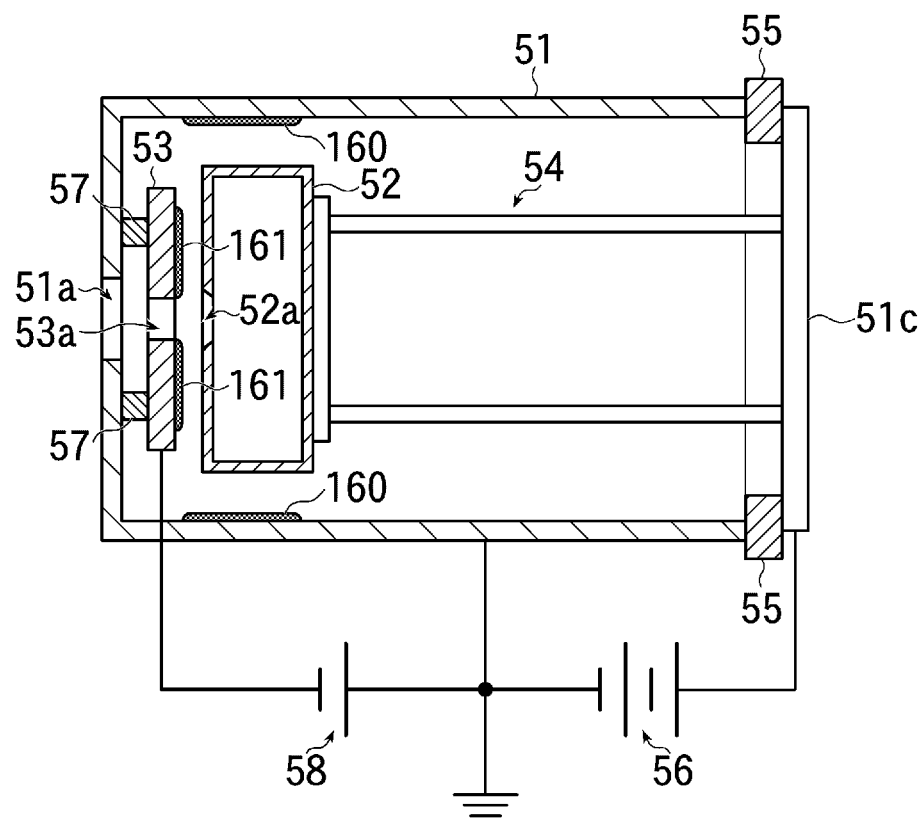
FIG. 10 is a partially cross-sectional view showing the internal configuration of an example of a conventional ion source.

The inventors have observed in detail the interior of the vacuum chamber 51 according to the conventional technique shown in FIG. 10 in which the above-discussed abnormal discharge occurred, and have found that no abnormal discharge occurs at the insulating film 161 deposited on the extraction electrode 53, and abnormal discharge occurs only at the insulating film 160 deposited on the inner wall 10d of the vacuum chamber 51 (discharge marks were found).

Here, the inventors have considered that this presence or absence of abnormal discharge is due to the temperatures of the insulating films 160 and 161.

That is, in the vacuum chamber 51 during operation, the temperature of the extraction electrode 53 is higher than 500 degrees Celsius, while the inner wall 10d of the vacuum chamber 51 is cooled, and thus its temperature is lower than 100 degrees Celsius.

The inventors have considered that as a result, the temperature of the insulating film 161 formed on the surface of the extraction electrode 53 is higher than the temperature of the insulating film 160 formed on the inner wall 10d of the vacuum chamber 51, and thus the insulating film 161 has conductivity and charge-up does not occur.

Then, the inventors placed the insulating film 161 (with a thickness of 410 μm) formed on the surface of the extraction electrode 53 in an atmospheric furnace and heated it, and measured the resistance value. The results are shown in FIGS. 8 and 9.

Figure 8:
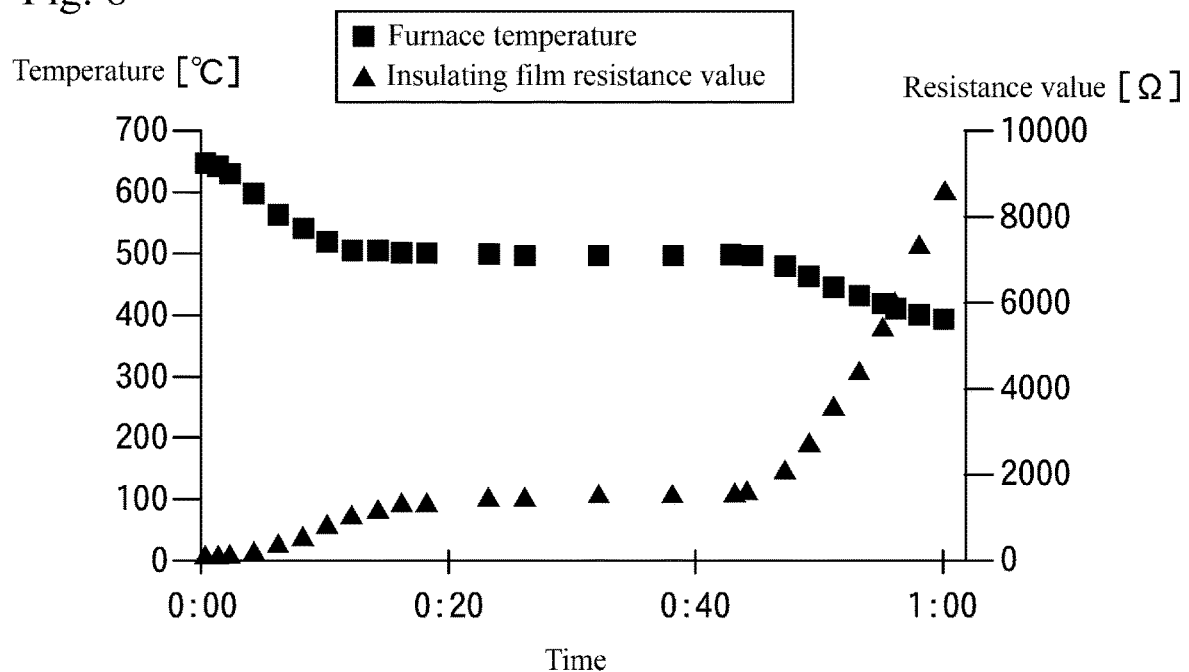
FIG. 8 is a graph showing the relationship between the temperature in an atmospheric furnace and the resistance value of an insulating film over time.
Figure 9:
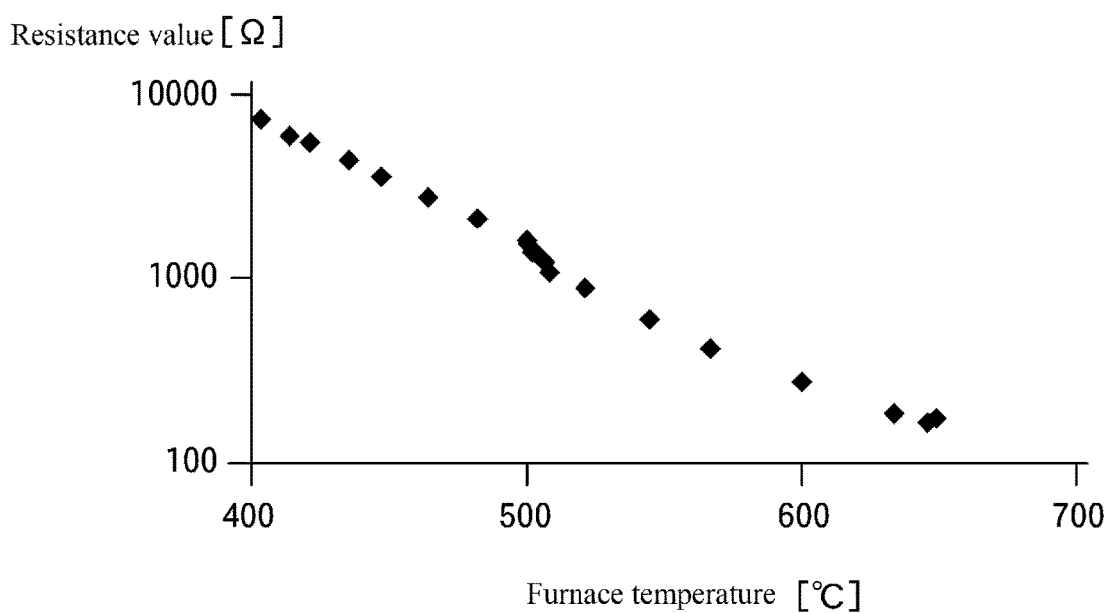
FIG. 9 is a graph showing the relationship between the temperature in the atmospheric furnace and the resistance value of the insulating film.

As understood from FIGS. 8 and 9, it has been found that the resistance value of the insulating film 161 greatly changes in the range of 400 degrees Celsius to 600 degrees Celsius, specifically, the resistance value tends to decrease as the temperature increases from 400 degrees Celsius.

Therefore, based on these findings, the inventors provided the above-discussed shielding member 30 in the vacuum chamber 10A of the ion source 10 shown in FIG. 2 to raise the temperature of the insulating film 60 deposited within the vacuum chamber 10A of the present embodiment. Then, the ion source 10 of this configuration was caused to generate aluminum ions under the same conditions as the ion source 50 according to the conventional technique, and emit an ion beam.

As a result, although the insulating films 60 and 61 were formed on the inner wall 31a of the main body 31 of the shielding member 30 and the surface 15b of the extraction electrode 15 in the vacuum chamber 10A as shown in FIG. 7, the frequency of occurrence of the above-discussed abnormal discharge was significantly reduced.

This is due to the following effect.

As discussed above, the shielding member 30 of the present embodiment is fitted in the vacuum chamber 10A by the tops 32a of the plurality of support portions 32 provided on the main body 31 being in point contact with the inner wall 10d of the vacuum chamber 10A.

Therefore, the temperature of the main body 31 of the shielding member 30 is hardly affected by the temperature (less than 100° C.) of the inner wall 10d of the vacuum chamber 10A cooled by the cooling mechanism, and is kept high temperature under the influence of radiant heat from, for example, the ion generation container 11 in the vacuum chamber 10A.

On this point, the inventors measured the temperature of the shielding member 30 while the ion source 10 of the present embodiment was in operation, and found that it was 400° C. or higher.

Thus, in the present embodiment, the temperature of the insulating film 60 deposited on the inner wall 31a of the main body 31 of the shielding member 30 was also 400° C. or higher. It is considered that this reduced the resistance value of the insulating film 60, preventing the occurrence of abnormal discharge.

As a result, the maintenance cycle of the ion source 10 has been able to be made longer (about twice) than the maintenance cycle of the conventional technique.

In the embodiment discussed above, the shielding member 30 having the plate-shaped main body 31 made of a conductive metal for blocking the deposition of an insulating material on the inner wall 10d of the vacuum chamber 10A is provided inside and in the vicinity of the inner wall 10d of the vacuum chamber 10A, so that the insulating film 60 formed by the by-product of reacting the ionized gas with the ion material so as to generate ions in the ion generation container 11 of the ion source 10 is not deposited on the inner wall 10d of the vacuum chamber 10A but is deposited on the surface of the main body 31 of the shielding member 30, that is, the inner wall 31a.

The main body 31 of the shielding member 30 is provided with the plurality of protruding support portions 32 that is in contact with the inner wall 10d of the vacuum chamber 10A for supporting the main body 31 in a manner such that the main body 31 is fitted at a distance from the inner wall 10d of the vacuum chamber 10A having the cooling mechanism. Consequently, the temperature of the main body 31 of the shielding member 30 during the operation of the ion source 10 is hardly affected by the temperature of the inner wall 10d of the vacuum chamber 10A cooled by the cooling mechanism, and is kept high temperature (at about some hundreds of degrees Celsius) under the influence of radiant heat from, for example, the ion generation container 11 in the vacuum chamber 10A.

As a result, according to the present embodiment, the temperature of the insulating film 60 deposited on the inner wall 31a of the main body 31 of the shielding member 30 is also about some hundreds of degrees Celsius, whereby the resistance value of the insulating film 60 decreases, and the occurrence of abnormal discharge is prevented. Consequently, the maintenance cycle of the ion source 10 can be made longer than that of the conventional technique.

Furthermore, in the present embodiment, the protruding support portions 32 of the shielding member 30 are in contact with the inner wall 10d of the vacuum chamber 10A at a plurality of contact points. Temperature changes in the vacuum chamber 10A cause the plurality of contact portions to expand and contract, thereby causing the contact portions to move. This can automatically remove oxide films on the inner wall 10d of the vacuum chamber 10A over a long period of time (self-cleaning).

Furthermore, in the present embodiment, if the shielding member 30 is configured to be attachably and detachably fitted in the vacuum chamber 10A, maintenance work can be easily performed by removing the shielding member 30 from the vacuum chamber 10A.

Moreover, in the present embodiment, because the shielding member 30 is configured to be electrically connected to the inner wall 10d of the vacuum chamber 10A when fitted in the vacuum chamber 10A, the potential of the shielding member 30 can be made equal to the potential of the vacuum chamber 10A (ground potential). Thereby, electrical discharges between the shielding member 30 and the inner wall 10d of the vacuum chamber 10A can be prevented.

In this case, in the present embodiment, the shielding member 30 is supported on the inner wall 10d of the vacuum chamber 10A by the plurality of protruding support portions 32, so that the contact resistance of the shielding member 30 against the inner wall 10d of the vacuum chamber 10A can be stabilized to achieve high connection reliability. Thus, electrical discharges between the shielding member 30 and the inner wall 10d of the vacuum chamber 10A can be reliably prevented.

Note that the present disclosure is not limited to the above-discussed embodiment, and various modifications can be made.

For example, the above embodiment has been discussed by taking as an example the case where the vacuum chamber is of a cylindrical shape and the shielding member is also of a cylindrical shape, but the present disclosure is not limited to this. For example, if the shape of the vacuum chamber is a square-tube shape, the shape of the shielding member may be formed in a square-tube shape in conformity with the shape of the vacuum chamber.

Further, in the above embodiment, the shielding member is provided to cover substantially the whole area of the inner wall of the vacuum chamber. Alternatively, the shielding member may be provided to cover, for example, only an area on which an insulating film tends to be deposited.

Furthermore, the above embodiment has been discussed by taking as an example the case where the aluminum fluoride is generated as the by-product of reacting the aluminum nitride or the like with $PF_3$, but the present disclosure is not limited to this, and is also applicable to the case where boron fluoride is generated as a by-product of reacting boron nitride (BN) with $BF_3$, for example.

REFERENCE SIGNS LIST 1 ion implantation apparatus
10 ion source
10A vacuum chamber
10c lid
10d inner wall
11 ion generation container
12 gas supply unit
15 extraction electrode
18 extraction power supply
19 acceleration power supply
30 shielding member
31 main body
31a inner wall
32 support portion
32a top
60, 61 insulating film

The invention claimed is:

1. An ion source comprising:
a vacuum chamber having a cooling mechanism;
an ion generation container provided in the vacuum chamber and configured to allow an ionized gas to react with an ion material so as to generate ions;
an extraction electrode provided in the vacuum chamber and configured to extract the ions generated in the ion generation container so as to generate an ion beam; and
a shielding member provided inside the vacuum chamber in the vicinity of an inner wall of the vacuum chamber, and having a main body made of a conductive metal that blocks deposition of an insulating material on the inner wall of the vacuum chamber,
wherein the main body of the shielding member is provided with a plurality of protruding support portions that is in contact with the inner wall of the vacuum chamber for supporting the main body so that the main body is fitted at a distance from the inner wall of the vacuum chamber.

2. The ion source according to claim 1, wherein the shielding member is configured to be attachably and detachably fitted in the vacuum chamber.

3. The ion source according to claim 1, wherein the shielding member is configured to be electrically connected to the inner wall of the vacuum chamber when fitted in the vacuum chamber.

4. The ion source according to claim 1, wherein the main body of the shielding member is formed from a plate-shaped member.

5. The ion source according to claim 1, wherein the main body of the shielding member is formed in a cylindrical shape.

6. An ion implantation apparatus comprising:
an ion source including:
a vacuum chamber having a cooling mechanism;
an ion generation container provided in the vacuum chamber and configured to allow an ionized gas to react with an ion material so as to generate ions;
an extraction electrode provided in the vacuum chamber and configured to extract the ions generated in the ion generation container so as to generate an ion beam; and
a shielding member provided inside the vacuum chamber in the vicinity of an inner wall of the vacuum chamber, and having a main body made of a conductive metal that blocks deposition of an insulating material on the inner wall of the vacuum chamber,
wherein the main body of the shielding member is provided with a plurality of protruding support portions that is in contact with the inner wall of the vacuum chamber for supporting the main body in a manner such that the main body is fitted at a distance from the inner wall of the vacuum chamber, and
wherein the ion implantation apparatus is configured to irradiate a substrate with the ion beam emitted from the ion source so as to implant ions.

7. The ion source according to claim 2, wherein the main body of the shielding member is formed from a plate-shaped member.

8. The ion source according to claim 2, wherein the main body of the shielding member is formed in a cylindrical shape.

* * * * *